(12) United States Patent
Yeh et al.

(10) Patent No.: US 10,333,275 B2
(45) Date of Patent: Jun. 25, 2019

(54) PACKAGING ASSEMBLY FOR HIGH-SPEED VERTICAL-CAVITY SURFACE-EMITTING LASER

(71) Applicant: TRUELIGHT CORPORATION, Hsinchu (TW)

(72) Inventors: Tzu-Ching Yeh, Hsinchu (TW); Yu-Fu Wu, Hsinchu (TW); Cheng-Ta Chen, Taichung (TW)

(73) Assignee: True Light Corporation (TW)

( * ) Notice: Subject to any disclaimer, the term of this patent is extended or adjusted under 35 U.S.C. 154(b) by 0 days.

(21) Appl. No.: 15/729,380

(22) Filed: Oct. 10, 2017

(65) Prior Publication Data

US 2019/0081455 A1 Mar. 14, 2019

(30) Foreign Application Priority Data

Sep. 8, 2017 (TW) .............................. 106130839 A

(51) Int. Cl.
*H01S 5/022* (2006.01)
*H01S 5/183* (2006.01)
*H01S 5/0683* (2006.01)

(52) U.S. Cl.
CPC ........ *H01S 5/0683* (2013.01); *H01S 5/02252* (2013.01); *H01S 5/02296* (2013.01); *H01S 5/183* (2013.01)

(58) Field of Classification Search
CPC ...... H01S 5/183–18397; H01S 5/0683–06837; H01S 5/0071; H01S 5/02292; H01S 5/022–02296
See application file for complete search history.

(56) References Cited

U.S. PATENT DOCUMENTS

| 5,761,229 A | * | 6/1998 | Baldwin | ............. | H01S 5/02288 372/109 |
| 6,031,952 A | * | 2/2000 | Lee | ...................... | G02B 6/2817 385/24 |
| 6,895,147 B2 | * | 5/2005 | Posamentier | ........ | G02B 6/4214 385/47 |
| 2003/0081645 A1 | * | 5/2003 | Uebbing | ............. | H01S 5/02292 372/101 |

* cited by examiner

*Primary Examiner* — Xinning(Tom) Niu
*Assistant Examiner* — Sean P Hagan

(57) ABSTRACT

A packaging assembly for a high-speed vertical-cavity surface-emitting laser (VCSEL) mainly applies a lens assembly consisted of several prisms to split a laser beam emitted by a VCSEL element so as to guide a small portion of the laser beam back to a monitor photodiode (MPD) and the rest of the laser beam to travel away along an optical axis. Such a spectacular design of the lens assembly can not only relieve the VCSEL element from a position right under the optical axis, but can also reduce signal loss by shorting a length of a bonding wire for a corresponding pin through disposing the VCSEL element further close to the corresponding pin. Thereupon, a defect of lights reflected from a lens or a translucent plate on a cap can be substantially improved.

6 Claims, 3 Drawing Sheets

PACKAGING ASSEMBLY FOR HIGH-SPEED VERTICAL-CAVITY SURFACE-EMITTING LASER

This application claims the benefit of Taiwan Patent Application Serial No. 106130839, filed Sep. 8, 2017, the subject matter of which is incorporated herein by reference.

BACKGROUND OF INVENTION

1. Field of the Invention

The invention relates to a packaging assembly for a high-speed vertical-cavity surface-emitting laser, and more particularly to the laser packaging assembly that mainly applies a lens assembly to split a laser beam emitted by a laser element so as to guide a small portion of the laser beam back to a monitor photodiode, thereby to relieve the laser element from a position right under the optical axis, thus able to dispose the laser element further close to a pin, and to shorten a length of a corresponding bonding wire.

2. Description of the Prior Art

Different to a conventional laser manufactured from an isolated cutout diode that emits a laser beam from an edge thereof, a vertical-cavity surface-emitting laser (VCSEL) is a semiconductor component that emits a laser beam perpendicular to a top surface thereof. In the art, to a conventional TO-CAN package for a VCSEL element, the VCSEL element is disposed at a center of the assembly, i.e. a position right under an optical axis. Thereupon, the laser beam emitted vertically from a top surface of the VCSEL element can travel directly along the optical axis. Nevertheless, the conventional TO-CAN package has two following defects. One of the defects is that, since a lens or a translucent plate is usually disposed on an optical window of a cap at the TO-CAN packaging assembly, and also since laser beams emitted by the VCSEL element disposed right under the TO-CAN packaging assembly travel vertically upward, thus a small portion of laser beams would be reflected back to the VCSEL element by the lens or the translucent plate on the cap, and thereby optical interference arises. The other defect thereof is that, since the VCSEL element is disposed right at the center of the packaging assembly, the distance between the VCSEL element and a signal-transmitting pin of the packaging assembly is rather too long. Namely, it is inevitable to introduce longer golden bonding wires to electrically connect corresponding pins of the packaging assembly. Thereupon, loss of signal transmission is substantially increased. Hence, the conventional TO-CAN package is hard to satisfy a rising demand for a higher transmission speed upon the VCSEL element of the light communication industry. Definitely, a further improvement upon the package of the VCSEL element for resolving the aforesaid shortcomings in the transmission speed is definitely welcome to the art.

SUMMARY OF THE INVENTION

Accordingly, it is the primary object of the present invention to provide a packaging assembly for a high-speed vertical-cavity surface-emitting laser, that mainly applies a lens assembly to split a laser beam emitted by a laser element so as to guide a small portion of the laser beam back to a monitor photodiode, thereby to relieve the laser element from a position right under an optical axis, thus able to dispose the laser element further close to a pin, and to shorten a length of a corresponding bonding wire. Thereupon, signal loss of the packaging assembly can be reduced, and the problem in the reflected light from a lens or a translucent plate on a cap can be substantially improved.

In the present invention, the packaging assembly for a high-speed vertical-cavity surface-emitting laser includes a header, a cap, a laser element, a monitor photodiode (MPD) and a lens assembly.

The header has an upper surface and a lower surface.

The cap, covering the header and thus forming an accommodation space between the cap and the header, is furnished thereon with an optical window. An optical axis is defined to penetrate the optical window by being perpendicular to the upper surface of the header.

The laser element, located on the upper surface of the header, is to emit a laser beam.

The monitor photodiode (MPD), located on the upper surface of the header, is to receive a portion of the laser beam emitted by the laser element for monitoring and feedback-controlling a luminous power of the laser element.

The lens assembly is located above the upper surface of the header by being positioned between the laser element and the optical window and also between the monitor photodiode and the optical window.

In the present invention, both the laser element and the monitor photodiode are not located on the optical axis, the lens assembly has thereinside a half-reflecting half-transmitting surface, the laser beam emitted by the laser element is directed into the lens assembly so as to split into a first light beam and a second light beam by the half-reflecting half-transmitting surface, the first light beam travels along the optical axis to leave the packaging assembly via the optical window, and the second light beam is directed to the monitor photodiode.

In one embodiment of the present invention, the lens assembly, formed as a trapezoidal structure in a cross-sectional direction, further includes a bottom surface, a first complete reflective surface, a top surface, a second complete reflective surface and the half-reflecting half-transmitting surface, the bottom surface is parallel to the upper surface of the header, one end of the first complete reflective surface is connected with an end of the bottom surface, the first complete reflective surface extends from the bottom surface toward the top surface by a first angle while another end of the first complete reflective surface is connected to the top surface, the top surface is parallel to the bottom surface, one end of the second complete reflective surface is connected with another end of the bottom surface, one end of the second complete reflective surface extends from the bottom surface toward the top surface by a second angle while another end of the second complete reflective surface is connected to the top surface, the half-reflecting half-transmitting surface is formed inside the lens assembly, and the half-reflecting half-transmitting surface is parallel to the first complete reflective surface.

In this embodiment, the laser beam emitted by the laser element is injected vertically into the lens assembly via the bottom surface, and then deflected to the half-reflecting half-transmitting surface by the first complete reflective surface; and, wherein, upon the laser beam hitting the half-reflecting half-transmitting surface, a large portion of the laser beam is reflected and deflected to travel through the top surface and then leave the packaging assembly via the optical window so as to form the first light beam, the rest of the laser beam penetrates the half-reflecting half-transmitting surface so as to form the second light beam, and the second light beam is further reflected and deflected by the second complete reflective surface, then leaves the lens assembly via the bottom surface, and is finally received by the monitor photodiode.

In one embodiment of the present invention, the lens assembly is consisted of a first prism and a second prism, the first prism is formed as a parallelogram structure in the cross-sectional direction, the second prism is formed as an isosceles triangular structure in the cross-sectional direction, and a junction surface of the first prism and the second prism is the half-reflecting half-transmitting surface.

In one embodiment of the present invention, at least one optical film is coated onto the half-reflecting half-transmitting surface so as to provide a function of half-reflection and half-transmission, and a refractive index of the at least one optical film is larger than that of any of the first prism and the second prism.

In one embodiment of the present invention, the first prism and the second prism are made of a BK7 borosilicate glass with the refractive index of 1.5168, the refractive index of the at least one optical film is within 1.52~2.5, the first angle defined by the first complete reflective surface and the bottom surface is 45°, the second angle defined by the second complete reflective surface and the bottom surface is 45°, a light intensity of the first light beam is about 80%~95% of the light intensity of the laser beam originally emitted by the laser element, and the light intensity of the second light beam is the rest of the light intensity of the laser beam originally emitted by the laser element.

In one embodiment of the present invention, the packaging assembly for a high-speed vertical-cavity surface-emitting laser further includes a light-transmitting component and a plurality of pins.

The light-transmitting component is furnished to the optical window.

The plurality of pins are furnished to the header by penetrating the upper surface and the lower surface of the header.

In this embodiment, the laser element is located close to one of the plurality of pins, and a bonding wire is applied to directly connect electrically the laser element and a bonding pad of the one of the plurality of pins.

In one embodiment of the present invention, the packaging assembly for a high-speed vertical-cavity surface-emitting laser further includes a sub-mount and a boss base.

The sub-mount, located on the upper surface of the header, is to mount the laser element and the monitor photodiode.

The boss base, located on the sub-mount by being disposed between the laser element and the monitor photodiode, is higher than the laser element and the monitor photodiode.

In this embodiment, the lens assembly is mounted on the boss base.

All these objects are achieved by the packaging assembly for a high-speed vertical-cavity surface-emitting laser described below.

BRIEF DESCRIPTION OF THE DRAWINGS

The present invention will now be specified with reference to its preferred embodiment illustrated in the drawings, in which.

DESCRIPTION OF THE PREFERRED EMBODIMENT

The invention disclosed herein is directed to a packaging assembly for a high-speed vertical-cavity surface-emitting laser. In the following description, numerous details are set forth in order to provide a thorough understanding of the present invention. It will be appreciated by one skilled in the art that variations of these specific details are possible while still achieving the results of the present invention. In other instance, well-known components are not described in detail in order not to unnecessarily obscure the present invention.

In the present invention, the packaging assembly for a high-speed vertical-cavity surface-emitting laser (VCSEL) mainly applies a lens assembly consisted of several prisms to split a laser beam emitted by a VCSEL element so as to guide a small portion of the laser beam back to a monitor photodiode (MPD) and the rest of the laser beam lot to travel away along an optical axis. Such a spectacular design of the lens assembly can not only relieve the VCSEL element from a position right under the optical axis, but can also reduce signal loss by shortening lengths of bonding wires through disposing the VCSEL element further close to corresponding pins. In addition, a defect of lights reflected from a lens or a translucent plate on a cap can be substantially improved.

Figure 1:
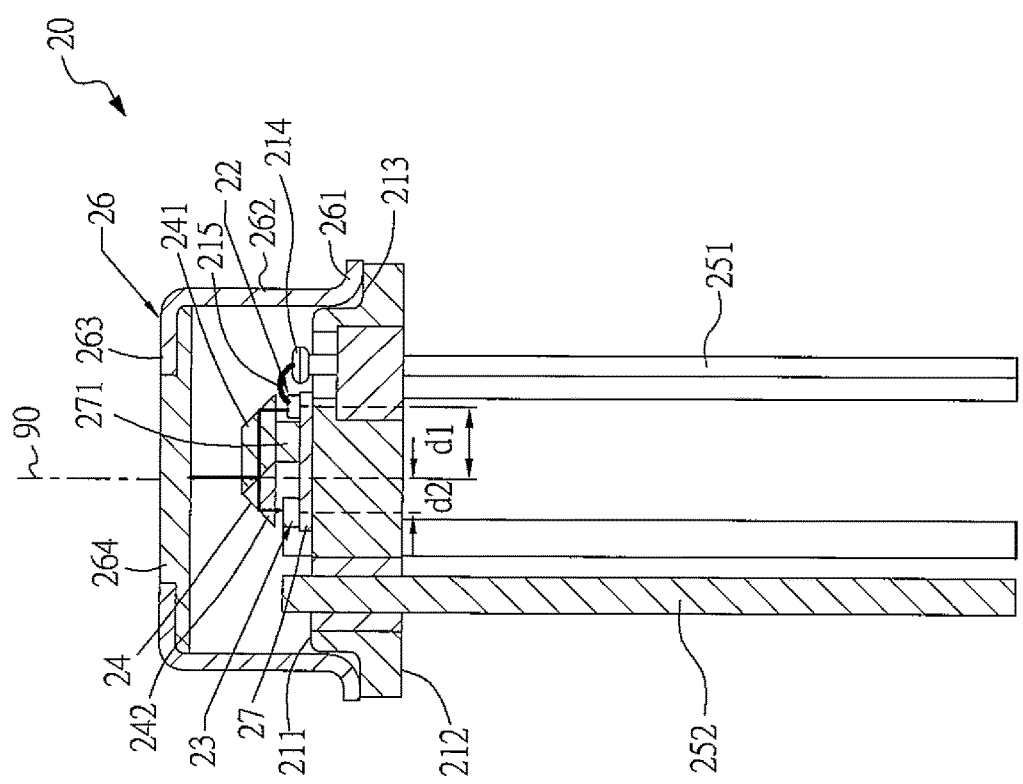
FIG. 1 is a schematically cross-sectional view of an embodiment of the packaging assembly for a high-speed vertical-cavity surface-emitting laser in accordance with the present invention.
Figure 2:
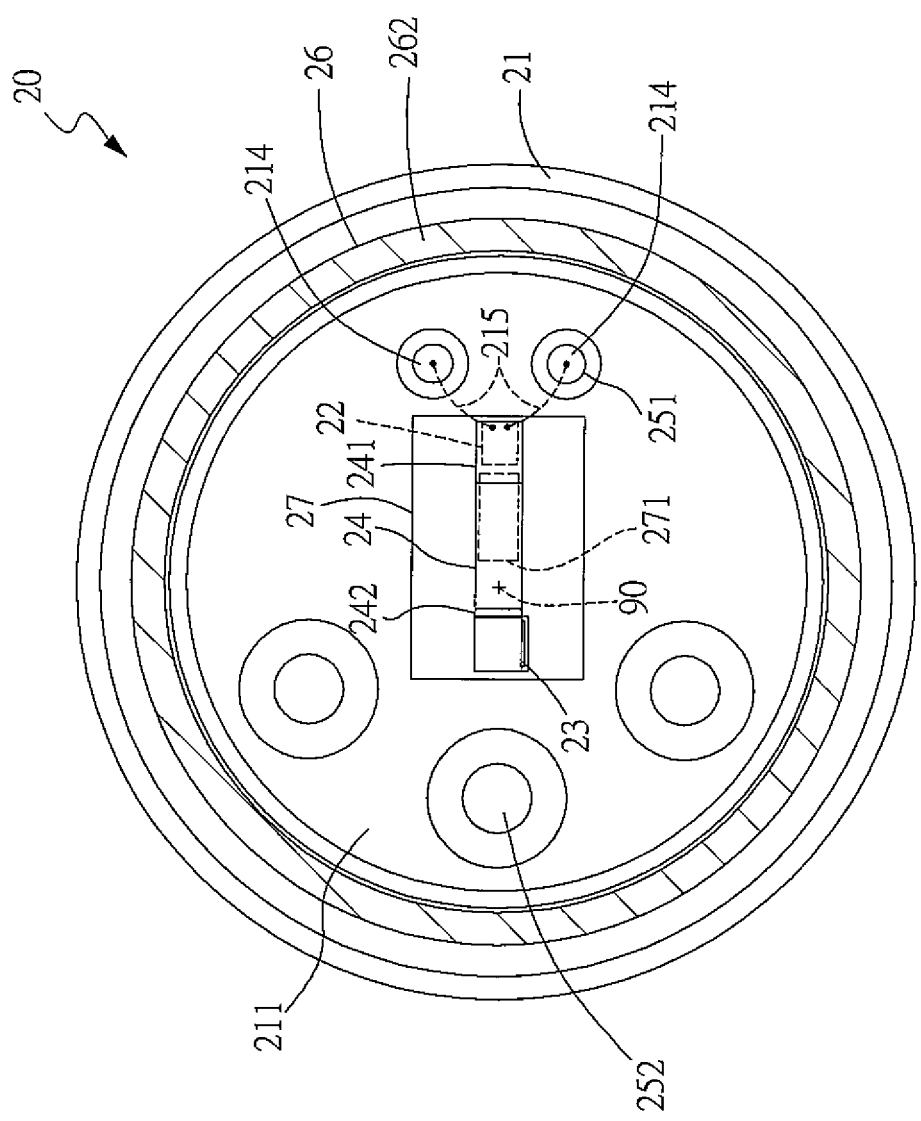
FIG. 2 is a schematically top view of FIG. 1.

Referring now to FIG. 1 and FIG. 2, which are schematically cross-sectional and top views of an embodiment of the packaging assembly for a high-speed vertical-cavity surface-emitting laser in accordance with the present invention, respectively. In this embodiment, the packaging assembly for a high-speed vertical-cavity surface-emitting laser 20, formed as an optical transceiver, largely includes a header 21, a VCSEL element 22 (or said briefly as a laser element), a monitor photodiode 23 (MPD), a lens assembly 24, a plurality of pins 251, 252, a cap 26, a light-transmitting component 264, and a sub-mount 27.

The header 21 for mounting, disposing and/or assembling other elements, has an upper surface 211, a lower surface 212, and a periphery 213 surrounding exteriorly the upper surface 211. The cap 26, formed as a hollow convex bowl member, is to cover the header 21, such that an accommodation space can be formed between the cap 26 and the header 21. In this embodiment, the cap 26 has an annular lower flange 261, an annular sidewall 262 extending upward from the lower flange 261, and a top surface 263 located on top of the sidewall 262. The lower flange 261 of the cap 26 is engaged firmly with the periphery 213 of the header 21 by gluing, supersonic adhering, interference fitting, or welding. An optical window is formed on the top surface 263 of the cap 26. An optical axis 90 is defined to penetrate the optical window and be perpendicular to the upper surface 211 of the header 21. Practically, the optical axis 90 defines an optical path for laser beams emitted by the laser element 22 to leave the packaging assembly 20. In this present invention, the optical axis 90 is perpendicular to the upper surface 211 of the header 21. The light-transmitting component 264, disposed at the optical window, is made of a transparent glass or plastics, and is not only to seal the optical window so as to reduce invasion of moisture to the accommodation space, but also to mount an optional optical member (a lens for example) on the light-transmitting component 264.

The laser element 22, located on the upper surface 211 of the header 21, can emit a laser beam. In the present invention, the laser element 22 is a VCSEL element to emit the laser beam upward. The monitor photodiode 23 (MPD), also located on the upper surface 211 of the header 21, is applied to receive a small portion of the laser beam emitted by the laser element 22, which is provided for monitoring and feedback-controlling a luminous power of the laser element 22. In the present invention, neither the laser element 22 nor the monitor photodiode 23 is located on the optical axis, but to opposing sides of the optical axis 90. Individual centers of the laser element 22 and the monitor photodiode 23 are spaced to the optical axis 90 by normal distances of d1 and d2, respectively. Namely, the laser beam emitted by the laser element 22 is not to go directly upward to leave the packaging assembly 20 exactly along the optical axis 90, but rather to be deflected firstly by the lens assembly 24 so as to go toward the optical axis 90 and then to leave the packaging assembly 20 along the optical axis 90.

In the present invention, the lens assembly 24, located above the upper surface 211 of the header 21, is disposed between the laser element 22 and the optical window (i.e. the light-transmitting component 264), and also between the monitor photodiode 23 and the optical window (i.e. the light-transmitting component 264). The lens assembly 24 has a half-reflecting half-transmitting surface. The laser beam emitted by the laser element 22 is projected into the lens assembly 24, and splits into a first light beam and a second light beam via the half-reflecting half-transmitting surface inside the lens assembly 24. As shown, the first light beam travels along the optical axis 90 to penetrate the optical window (i.e. the light-transmitting component 264) and then leave the packaging assembly 20. On the other hand, the second light beam is directed to the monitor photodiode 23.

In the present invention, the sub-mount 27 is disposed on the upper surface 211 of the header 21, and the laser element 22 and the monitor photodiode 23 are both mounted on the same sub-mount 27. Practically, a boss base 271 is located on an upper surface of the sub-mount 27 by disposing between the laser element 22 and the monitor photodiode 23. In addition, a height (or thickness) of the boss base 271 is larger than that of any of the laser element 22 and the monitor photodiode 23. Further, since the lens assembly 24 is disposed on the boss base 271, the lens assembly 24 is higher than each of the laser element 22 and the monitor photodiode 23, so that the laser element 22 and the monitor photodiode 23 are located to a lower right side and a lower left side of the lens assembly 24, respectively, by slightly deviating away from the lens assembly 24.

Figure 3:
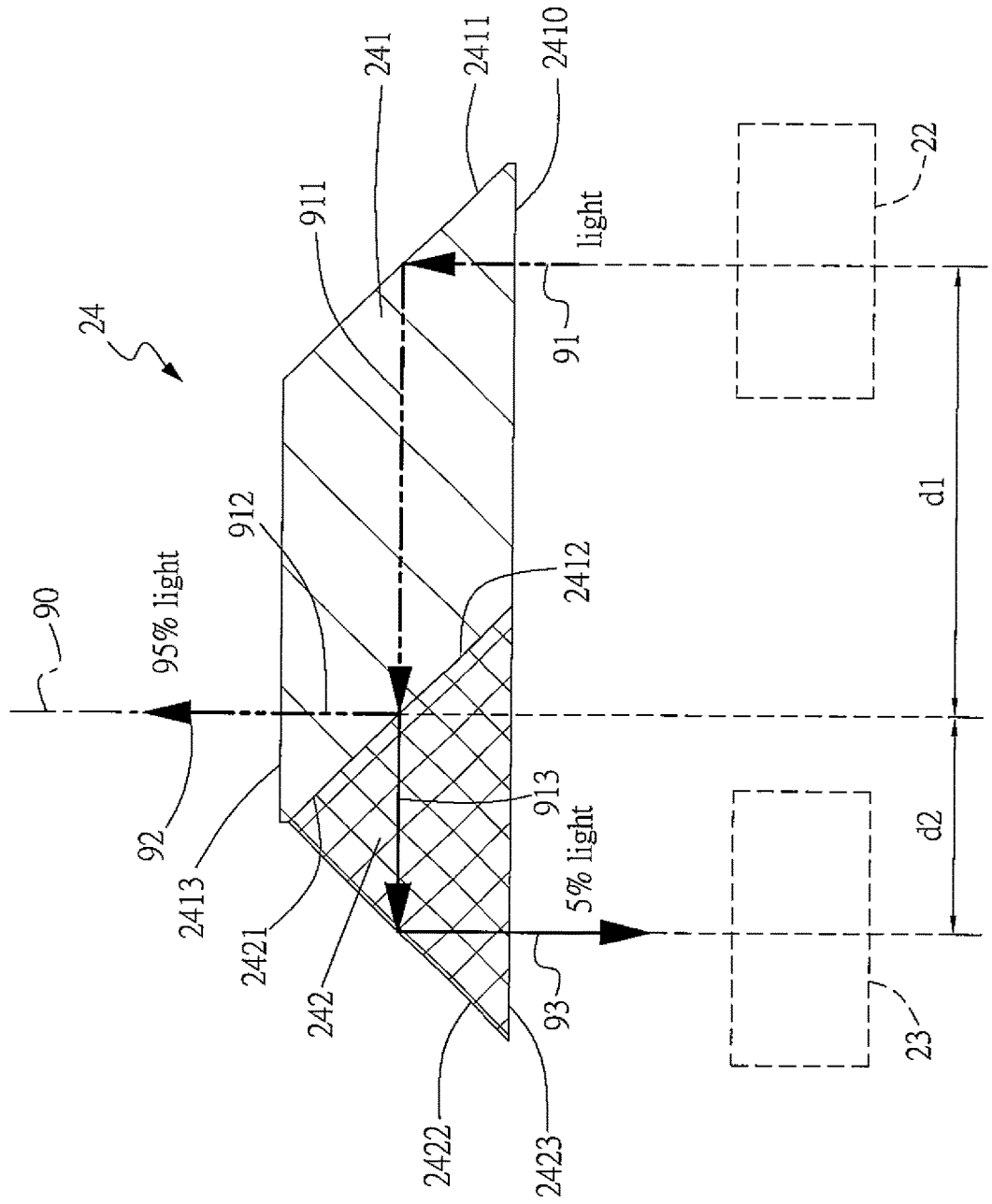
FIG. 3 is a schematically cross-sectional view of an exemplary embodiment of the lens assembly of FIG. 1.

Referring now to FIG. 3, a schematically cross-sectional view of an exemplary embodiment of the lens assembly of FIG. 1 is shown. In this embodiment, the lens assembly 24, shaped as a trapezoidal structure as a whole in a cross-sectional view, includes a bottom surface, a first complete reflective surface 2411, a top surface 2413, a second complete reflective surface 2422, and the half-reflecting half-transmitting surface 2412. The bottom surface is consisted of a right-bottom surface 2410 and a left-bottom surface 2423. In the following description, the term "bottom surface 2410, 2423" is used to stand for a combination of the right-bottom surface 2410 and the left-bottom surface 2423. The bottom surface 2410, 2423 is parallel to the upper surface 211 of the header 21. One end (lower end) of the first complete reflective surface 2411 is connected with a right end of the right-bottom surface 2410, and the first complete reflective surface 2411 is extended from the right-bottom surface 2410 toward the top surface 2413 in a first angle so as to have another end (upper end) of the first complete reflective surface 2411 to connect a right end of the top surface 2413. The top surface 2413 is parallel to the bottom surface 2410, 2423. One end (lower end) of the second complete reflective surface 2422 is connected with a left end of the left-bottom surface 2423, and the second complete reflective surface 2422 is extended from the left-bottom surface 2423 toward the top surface 2413 in a second angle so as to have another end (upper end) of the second complete reflective surface 2422 to connect or adjoin a left end of the top surface 2413. The half-reflecting half-transmitting surface 2412 is constructed inside the lens assembly 24, and the half-reflecting half-transmitting surface 2412 is parallel to the first complete reflective surface 2411. The laser beam 91 emitted by the laser element 22 is firstly injected upward vertically into the lens assembly 24 from the right-bottom surface 2410. Then, the incident laser beam 91 hits the first complete reflective surface 2411, and is deflected to travel horizontally toward the half-reflecting half-transmitting surface 2412 (shown as the laser beam 911 of FIG. 3). Thereafter, the laser beam 911 traveling inside the lens assembly 24 would finally hit the half-reflecting half-transmitting surface 2412. Then, a large portion of the laser beam 911 would be reflected and deflected vertically upward to travel along the optical axis 90 and leave the lens assembly 24 from the top surface 2413, shown as the laser beam 912 of FIG. 3. The outgoing laser beam 912 would be directed to the optical window, and thus form the first light beam 92. On the other hand, at the half-reflecting half-transmitting surface 2412, a small portion (the rest) of the laser beam 911 would penetrate through the half-reflecting half-transmitting surface 2412, and then the penetrating laser beam 913 would hit the second complete reflective surface 2422. Then, the laser beam 913 would be deflected by the second complete reflective surface 2422 so as to form the second light beam 93 traveling vertically downward and finally leaving the lens assembly 24 after penetrating the left-bottom surface 2423. The outgoing second light beam 93 would be finally received by the monitor photodiode 23.

In this embodiment, the lens assembly 24 is consisted of a first prism 241 and a second prism 242. Viewing from the cross-sectional direction, the first prism 241 is shaped as a parallelogram structure, while the second prism 242 is shaped as an isosceles triangular structure. The junction surface of the first prism 241 and the second prism 242 is exactly the half-reflecting half-transmitting surface 2412. By properly coating at least one optical film, then the half-reflecting half-transmitting surface 2412 can thereby perform a function of half-reflection and half-transmission. The at least one optical film can be plated on the half-reflecting half-transmitting surface 2412 of the first prism 241, or on the half-reflecting half-transmitting surface 2421 of the second prism 242. In this embodiment, at least one of the optical films has a refractive index (n-index) larger than the refractive index of the material for producing the first prism 241 and the second prism 242. In one embodiment of the present invention, one of many qualified materials for the first prism 241 and the second prism 242 is a BK7 borosilicate glass having a refractive index of 1.5168. In addition, at least one of the optical films has a refractive index (n-index) ranging within 1.52~2.5. Further, the first angle is an angle defined by the first complete reflective surface 2411 and the right-bottom surface 2410, preferably an angle of 45°; and, the second angle is an angle defined by the second complete reflective surface 2422 and the left-bottom surface 2423, preferably an angle of 45°. In addition, a light intensity of the first light beam 92 is about 80%~95% of the light intensity of the laser beam 91 originally emitted by the laser element 22, while the rest of the light intensity is contributed to the second light beam 93. In the present invention, the percentages of the light intensity for the first light beam 92 and the second light beam 93 can be determined by evaluating the structure and the refractive index of the at least one optical film coated on the half-reflecting half-transmitting surface 2412.

As shown in FIG. 1 and FIG. 2 of the present invention, a plurality of pins 251, 252 are furnished to the header 21 by firstly penetrating both the upper surface 211 and the lower surface 212 of the header 21 and then extending downward by a predetermined length. The plurality of pins 251, 252 include at least one signal pin 251 for transmitting signals and one ground pin 252. In the packaging assembly of the present invention, by including the lens assembly 24, the horizontal position of the laser element 22 can be offset from the optical axis 90 and thus become closer to the signal pin 251. In addition, the laser element 22 applies bonding wires 215 to electrically connect corresponding bonding pads 214 of the respective pins 251. In comparison with the conventional packaging assembly whose laser element is located right on the optical axis, the packaging assembly of the present invention enables the laser element 20 to be disposed at a position much closer to the signal pin 251, such that the required length of the bonding wire 215 can be reduced substantially so as to minimize the signal loss. Further, Since the laser element 20 of the present invention can be located away from the optical axis 90, thus direct influence of the reflected light deflected from the light-transmitting component 264 (lens or translucent plate) on the cap 26 upon the laser element 22 would be substantially reduced due to the existence of the lens assembly 24. Thereupon, related shortcomings in the art can thus be improved significantly.

While the present invention has been particularly shown and described with reference to a preferred embodiment, it will be understood by those skilled in the art that various changes in form and detail may be without departing from the spirit and scope of the present invention.

What is claimed is:

1. A packaging assembly for a high-speed vertical-cavity surface-emitting laser, comprising:
   a header, having an upper surface and a lower surface;
   a cap, covering the header and thus forming an accommodation space between the cap and the header, furnished thereon with an optical window, an optical axis being defined to penetrate the optical window by being perpendicular to the upper surface of the header;
   a laser element, located on the upper surface of the header, being to emit a laser beam;
   a monitor photodiode (MPD), located on the upper surface of the header, being to receive a portion of the laser beam emitted by the laser element for monitoring and feedback-controlling a luminous power of the laser element; and
   a prismatic assembly, located above the upper surface of the header by being positioned between the laser element and the optical window and also between the monitor photodiode and the optical window;
   wherein both the laser element and the monitor photodiode are not located on the optical axis, the prismatic assembly has thereinside a partially reflecting surface, the laser beam emitted by the laser element is directed into the prismatic assembly so as to split into a first light beam and a second light beam by the partially reflecting surface, the first light beam travels along the optical axis to leave the packaging assembly via the optical window, and the second light beam is directed to the monitor photodiode;
   wherein the prismatic assembly formed as a trapezoidal structure in a cross-sectional direction further includes a bottom surface, a first complete reflective surface, a top surface, a second complete reflective surface and the partially reflecting surface, the bottom surface is parallel to the upper surface of the header, one end of the first complete reflective surface is connected with an end of the bottom surface, the first complete reflective surface extends from the bottom surface toward the top surface by a first angle, another end of the first complete reflective surface is connected to the top surface, the top surface is parallel to the bottom surface, one end of the second complete reflective surface is connected with another end of the bottom surface, the second complete reflective surface extends from the bottom surface toward the top surface by a second angle, another end of the second complete reflective surface is connected to the top surface, the partially reflecting surface is formed inside the prismatic assembly, and the partially reflecting surface is parallel to the first complete reflective surface;
   wherein the laser beam emitted by the laser element is injected vertically into the prismatic assembly via the bottom surface, and then deflected to the partially reflecting surface by the first complete reflective surface;
   wherein, upon the laser beam hitting the partially reflecting surface, a large portion of the laser beam is reflected and deflected to travel through the top surface and then leave the packaging assembly via the optical window so as to form the first light beam, the rest of the laser beam penetrates the partially reflecting surface so as to form the second light beam, and the second light beam is further reflected and deflected by the second complete reflective surface, then leaves the prismatic assembly via the bottom surface, and is finally received by the monitor photodiode;
   wherein, the laser beam, the second light beam, the first light beam and the optical axis are all in a vertical direction; the first light beam is located between, spaced apart from, and also parallel to both the incident laser beam and the second light beam;
   wherein, the partially reflecting surface is NOT located right above the laser element nor the monitor photodiode; the partially reflecting surface is located right on the optical axis; neither the laser element nor the monitor photodiode is located right on the optical axis.

2. The packaging assembly for a high-speed vertical-cavity surface-emitting laser of claim 1, wherein the prismatic assembly is consisted of a first prism and a second prism, the first prism is formed as a parallelogram structure in the cross-sectional direction, the second prism is formed as an isosceles triangular structure in the cross-sectional direction, and a junction surface of the first prism and the second prism is the partially reflecting surface.

3. The packaging assembly for a high-speed vertical-cavity surface-emitting laser of claim 2, wherein at least one optical film is coated onto the partially reflecting surface so as to provide a function of half-reflection and half-transmission, and a refractive index of the at least one optical film is larger than that of any of the first prism and the second prism.

4. The packaging assembly for a high-speed vertical-cavity surface-emitting laser of claim 3, wherein the first prism and the second prism are made of a BK7 borosilicate glass with the refractive index of 1.5168, the refractive index of the at least one optical film is within 1.52~2.5, the first angle defined by the first complete reflective surface and the bottom surface is 45°, the second angle defined by the second complete reflective surface and the bottom surface is 45°, a light intensity of the first light beam is about 80%-95% of the light intensity of the laser beam originally emitted by the laser element, and the light intensity of the second light beam is the rest of the light intensity of the laser beam originally emitted by the laser element.

5. The packaging assembly for a high-speed vertical-cavity surface-emitting laser of claim 1, further including:
   a light-transmitting component, furnished to the optical window; and
   a plurality of pins, furnished to the header by penetrating the upper surface and the lower surface of the header;
   wherein the laser element is located close to one of the plurality of pins, and a bonding wire is applied to directly connect electrically the laser element and a bonding pad of the one of the plurality of pins.

6. The packaging assembly for a high-speed vertical-cavity surface-emitting laser of claim 1, further including:
   a sub-mount, located on the upper surface of the header, being to mount the laser element and the monitor photodiode; and
   a boss base, located on the sub-mount by being disposed between the laser element and the monitor photodiode, being higher than the laser element and the monitor photodiode;
   wherein the prismatic assembly is mounted on the boss base.

* * * * *